(12) United States Patent
Yang

(10) Patent No.: US 12,424,535 B2
(45) Date of Patent: Sep. 23, 2025

(54) CHIP ON FILMS AND DISPLAY MODULES

(71) Applicant: Shenzhen China Star Optoelectronics Semiconductor Display Technology Co., Ltd., Guangdong (CN)

(72) Inventor: Yuhua Yang, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 103 days.

(21) Appl. No.: 18/464,259

(22) Filed: Sep. 10, 2023

(65) Prior Publication Data

US 2024/0222252 A1 Jul. 4, 2024

(30) Foreign Application Priority Data

Dec. 29, 2022 (CN) .......................... 202211711289.9

(51) Int. Cl.
*H01L 23/498* (2006.01)
*H01L 23/13* (2006.01)
(Continued)

(52) U.S. Cl.
CPC ........ *H01L 23/49838* (2013.01); *H01L 23/13* (2013.01); *H01L 23/49833* (2013.01);
(Continued)

(58) Field of Classification Search
CPC ............... H01L 23/13; H01L 23/49833; H01L 23/49838; H05K 1/18; H05K 2201/1053
See application file for complete search history.

(56) References Cited

U.S. PATENT DOCUMENTS

| | | | | |
|---|---|---|---|---|
| 5,224,023 A | * | 6/1993 | Smith | ..................... G06F 1/184 174/254 |
| 2008/0074830 A1 | * | 3/2008 | Kurasawa | .............. H05K 3/361 361/749 |

(Continued)

FOREIGN PATENT DOCUMENTS

| | | |
|---|---|---|
| CN | 101226912 A | 7/2008 |
| JP | 2001201757 A | 7/2001 |

(Continued)

OTHER PUBLICATIONS

Chinese Office Action issued in corresponding Chinese Patent Application No. 202211711289.9 dated Jul. 12, 2025, pp. 1-7.

*Primary Examiner* — Nathan Milakovich
(74) *Attorney, Agent, or Firm* — PV IP PC; Wei Te Chung

(57) ABSTRACT

Display modules and chip on films are provided. The chip on film includes a body part and a first reinforcing part. The body part includes a first bonding portion, a second bonding portion, and a connecting portion connected between the first and second bonding portions. The first reinforcing part is connected to the first bonding portion and includes a first extending portion extending from at least one end of the first bonding portion in a direction away from the first bonding portion. The first bonding portion is provided with first bonding terminals arranged at intervals, the second bonding portion is provided with second bonding terminals arranged at intervals, the first extending portion is provided with at least one third bonding terminal, each first bonding terminal is electrically connected to a corresponding second bonding terminal, and the third bonding terminal is insulated from the second bonding terminals.

20 Claims, 4 Drawing Sheets

(51) Int. Cl.
  *H01L 23/544* (2006.01)
  *H05K 1/18* (2006.01)
(52) U.S. Cl.
  CPC ............ *H01L 23/544* (2013.01); *H05K 1/18* (2013.01); *H01L 2223/54426* (2013.01); *H05K 2201/10128* (2013.01); *H05K 2201/10378* (2013.01); *H05K 2201/1053* (2013.01); *H05K 2201/10537* (2013.01)

(56) References Cited

U.S. PATENT DOCUMENTS

| | | | | |
|---|---|---|---|---|
| 2013/0021571 | A1* | 1/2013 | Lee | H05K 3/3452 349/150 |
| 2013/0044443 | A1* | 2/2013 | Yoshifusa | G06F 3/04164 361/749 |
| 2020/0243039 | A1* | 7/2020 | Han | G09G 5/006 |
| 2020/0388657 | A1* | 12/2020 | Huang | H10K 59/12 |
| 2021/0405714 | A1* | 12/2021 | Fu | H05K 1/147 |

FOREIGN PATENT DOCUMENTS

| | | |
|---|---|---|
| TW | 200832663 A | 8/2008 |
| WO | WO-2024065412 A1 * | 4/2024 |

\* cited by examiner

CHIP ON FILMS AND DISPLAY MODULES

CROSS-REFERENCE TO RELATED APPLICATION

This application claims priority to Chinese Patent Application No. 202211711289.9, filed on Dec. 29, 2022, the disclosure of which is incorporated herein by reference in its entirety.

TECHNICAL FIELD

The present disclosure relates to the field of display technologies, and in particular, to chip on films and display modules.

BACKGROUND

With the advancement of display technology, display devices with a high screen-to-body ratio have gradually become the mainstream trend in the market. To achieve a high screen-to-body ratio, the borders need to be narrowed. The use of chip on film (COF) technology may effectively narrow the border. The COF technology is a technology that uses a flexible circuit board as a package chip carrier to bond the chip.

In recent years, curved display devices have become popular due to their more fashionable appearance and stronger visual effects. And with the development of curved display technology, the curved display device has been upgraded from the previous R4000/R3500 technology to R1500/R1000 technology. However, as a curvature value of the curved display device decreases, a stress of distortion of the COF increases, which makes the bonding between the COF and the display panel prone to peeling.

SUMMARY

In view of above, chip on films are provided according to embodiments of the present disclosure. The chip on film includes a body part and a first reinforcing part; the body part includes a first bonding portion, a second bonding portion, and a connecting portion connected between the first bonding portion and the second bonding portion; the first reinforcing part is connected to the first bonding portion and includes a first extending portion extending from at least one of two opposite ends of the first bonding portion in a direction away from the first bonding portion; the first bonding portion is provided with a plurality of first bonding terminals arranged at intervals, the second bonding portion is provided with a plurality of second bonding terminals arranged at intervals, the first extending portion is provided with at least one third bonding terminal, each of the first bonding terminals is electrically connected to a corresponding one of the second bonding terminals, and the third bonding terminal is insulated from the second bonding terminals.

Display modules are further provided according to embodiments of the present disclosure. The display module includes a display panel, at least one above-mentioned chip on film, and a printed circuit board electrically connected to the display panel through the chip on film.

BRIEF DESCRIPTION OF THE DRAWINGS

In order to more clearly illustrate the technical solutions in the embodiments or the related art, the accompanying drawings that need to be used in the description of the embodiments or the prior art will be briefly introduced below. Obviously, the accompanying drawings in the following description are only some embodiments of the invention, those of ordinary skill in the art may also obtain other drawings based on these drawings without creative effort.

DETAILED DESCRIPTION

Figure 1:
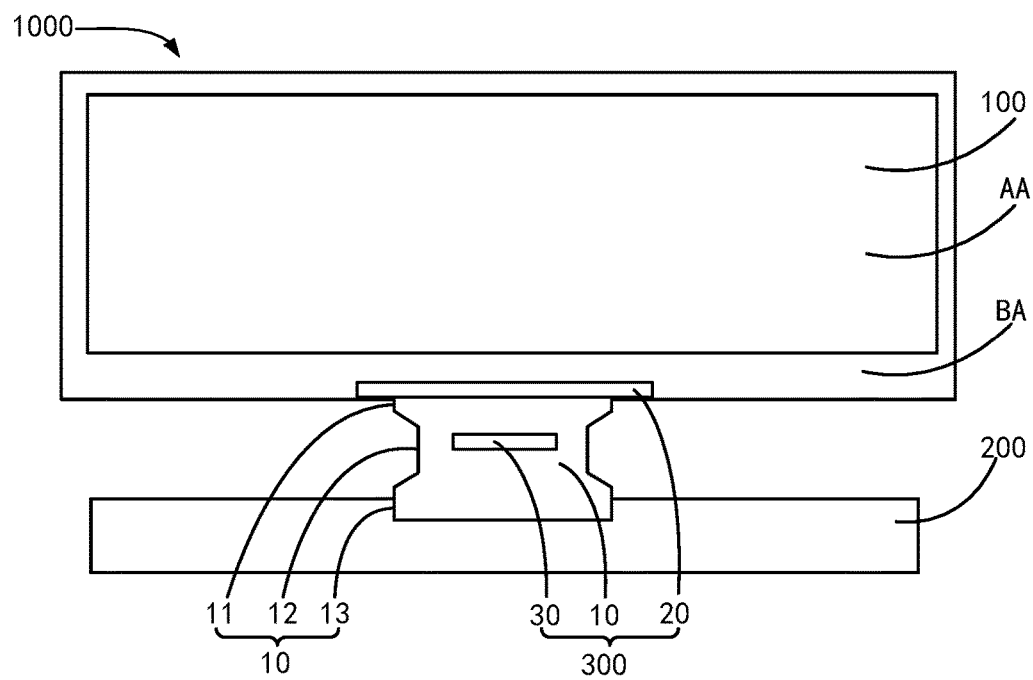
FIG. 1 is a schematic top view of a display module provided according to an embodiment of the present disclosure.

The following descriptions of the various embodiments refer to the accompanying drawings to illustrate specific embodiments in which the present disclosure may be practiced. The orientational terms mentioned in this disclosure, such as "top", "bottom", "front", "rear", "left", "right", "inside", "outside", "side", etc., just refer to the orientations of the accompanying drawings. Therefore, the orientational terms used are for explaining and understanding the present disclosure, but not intended to limit the present disclosure. In the accompanying drawings, structurally similar elements are denoted by the same reference numerals. In the drawings, the thicknesses of some layers and regions are exaggerated for clear understanding and ease of description. That is, the size and thickness of each component illustrated in the drawings are arbitrarily shown, but the present disclosure is not limited thereto.

Display modules are provided in embodiments of the present disclosure. Referring to FIG. 1, the display module 1000 includes a display panel 100, a printed circuit board 200, and at least one chip on film (COF) 300. The display panel 100 is electrically connected to the printed circuit board 200 through the COF 300.

In some embodiments, the printed circuit board 200 refers to a printed circuit board assembly (PCBA) board. The PCBA board is formed by soldering electronic components on the printed circuit board 200. A material of the printed circuit board 200 includes a resin material. The printed circuit board 200 is configured to process an input signal of the display panel 100, and then input it to the display panel 100 through the COF 300, so as to realize the processing and power supplying of an in-plane signal of the display panel 100.

The COF 300 includes a body part 10 and a first reinforcing part 20. The body part 10 includes a first bonding portion 11, a connecting portion 12, and a second bonding portion 13 connected in sequence. The connecting portion 12 is connected to the first bonding portion 11 and the second bonding portion 13. The first reinforcing part 20 is connected to the first bonding portion 11. The first reinforcing part 20 includes a first extending portion (the first sub-extending portion 21 and the second sub-extending portion 22 illustrated in FIG. 2) formed by extending from at least one of the two opposite ends of the first bonding portion 11 in a direction away from the first bonding portion 11. The first bonding portion 11 and the first extending portion of the first reinforcing part 20 are bound together on the display panel 100. The second bonding portion 13 is bound on the printed circuit board 200.

The display panel 100 includes a display area AA and a bonding area BA located on a side of the display area AA. The first bonding portion 11 and the first extending portion of the first reinforcing part 20 are bound together in the bonding area BA of the display panel 100. In some embodiments, the display panel 100 is a liquid crystal display panel, an organic light emitting diode display panel, or the like. Taking the liquid crystal display panel as an example, the liquid crystal display panel generally includes structures such as a backlight module, a liquid crystal cell, and a polarizer. The liquid crystal cell includes an array substrate, a color filter substrate, and a liquid crystal layer between the array substrate and the color filter substrate. However, the present disclosure is not limited thereto, and the display panel 100 of the present disclosure may adopt various known liquid crystal display panels, which will not be repeated here.

Figure 2:
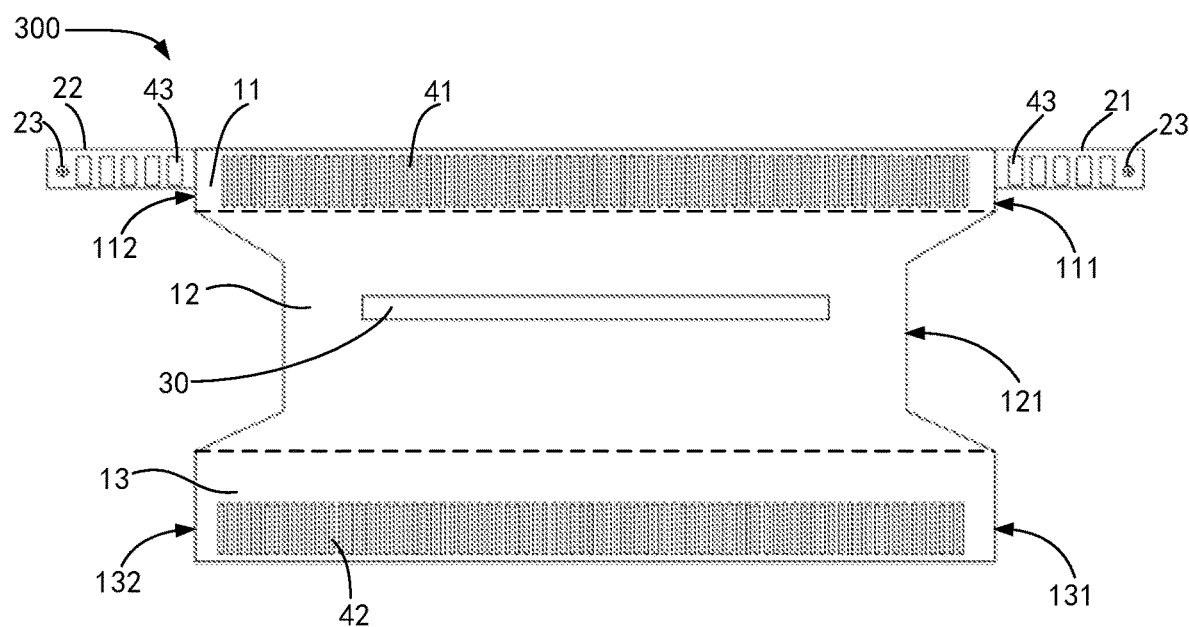
FIG. 2 is a schematic top view of a COF provided according to an embodiment of the present disclosure.

Referring to FIG. 2, the first bonding portion 11 is provided with a plurality of first bonding terminals 41 arranged at intervals. The second bonding portion 13 is provided with a plurality of second bonding terminals 42 arranged at intervals. At least one third bonding terminal 43 is disposed on the first extending portion. The first bonding terminal 41 is electrically connected to the corresponding second bonding terminal 42. The third bonding terminal 43 is insulated from the second bonding terminals 42.

The COF 300 further includes a driver integrated circuit (IC) 30 bound on the connecting portion 12. The first bonding terminal 41 is electrically connected with the corresponding second bonding terminal 42 through the driver IC 30. Specifically, the connecting portion 12 is also provided with a plurality of connecting wires, the first bonding terminal 41 is electrically connected to the driver IC 30 through a corresponding connecting wire, and the second bonding terminal 42 is also electrically connected to the driver IC 30 through a corresponding connecting wire, so as to realize the electrical connection between the first bonding terminal 41 and the second bonding terminal 42.

The first bonding portion 11 is bound to the display panel 100 through the first bonding terminals 41, and the second bonding portion 13 is bound to the printed circuit board 200 through the second bonding terminals 42, so as to realize the electrical connection between the display panel 100 and the printed circuit board 200. Of course, the bonding area BA of the display panel 100 is provided with bonding terminals (not shown) corresponding to the first bonding terminals 41, so as to realize the connection between the first bonding portion 11 and the display panel 100. The printed circuit board 200 is also provided with bonding terminals (not shown) corresponding to the second bonding terminals 42, so as to realize the connection between the second bonding portion 13 and the printed circuit board 200.

The insulation between the third bonding terminal 43 and the second bonding terminals 42 means that there is no electrical connection between the third bonding terminal 43 and the second bonding terminal 42, so that the third bonding terminal 43 does not have the function of transmitting signals, but the first bonding terminal 41 has the function of transmitting signals, so the third bonding terminal 43 and the first bonding terminal 41 have different functions.

The first extending portion is bound to the display panel 100 through the third bonding terminal 43, so that the first reinforcing part 20 is bound to the display panel 100. Of course, the display panel 100 is also provided with a bonding terminal corresponding to the third bonding terminal 43 (not illustrated in the figure), and the bonding terminal of the display panel 100 bound to the third bonding terminal 43 is not connected to the signal lines in the display panel 100.

In the embodiment, the first reinforcing part 20 is arranged to be connected to the first bonding portion 11, and the first reinforcing part 20 is also bound to the display panel 100, so the first bonding portion 11 is reinforced, thereby increasing a bound area of the COF 300 to the display panel 100 and increasing a bound adhesion of the COF 300 to the display panel 100, so that a peeling force of the COF 300 may be increased, and a twist resistance of the COF 300 in a curved state may be improved, thereby reducing risk of peeling at the bonding of the COF 300 to the display panel.

In some embodiments, the two opposite ends of the first bonding portion 11 are a first end 111 and a second end 112. The first reinforcing part 20 includes a first sub-extending portion 21 extending from the first end 111 in a direction away from the first bonding portion 11 and a second sub-extending portion 22 extending from the second end 112 in a direction away from the first bonding portion 11. In this way, the reinforcing effect of the first reinforcing part 20 may be improved by arranging the two extending portions, so that the COF 300 and the display panel 100 is bound more firmly. The first sub-extending portion 21 and the second sub-extending portion 22 are symmetrical about the first bonding portion 11.

Figure 3:
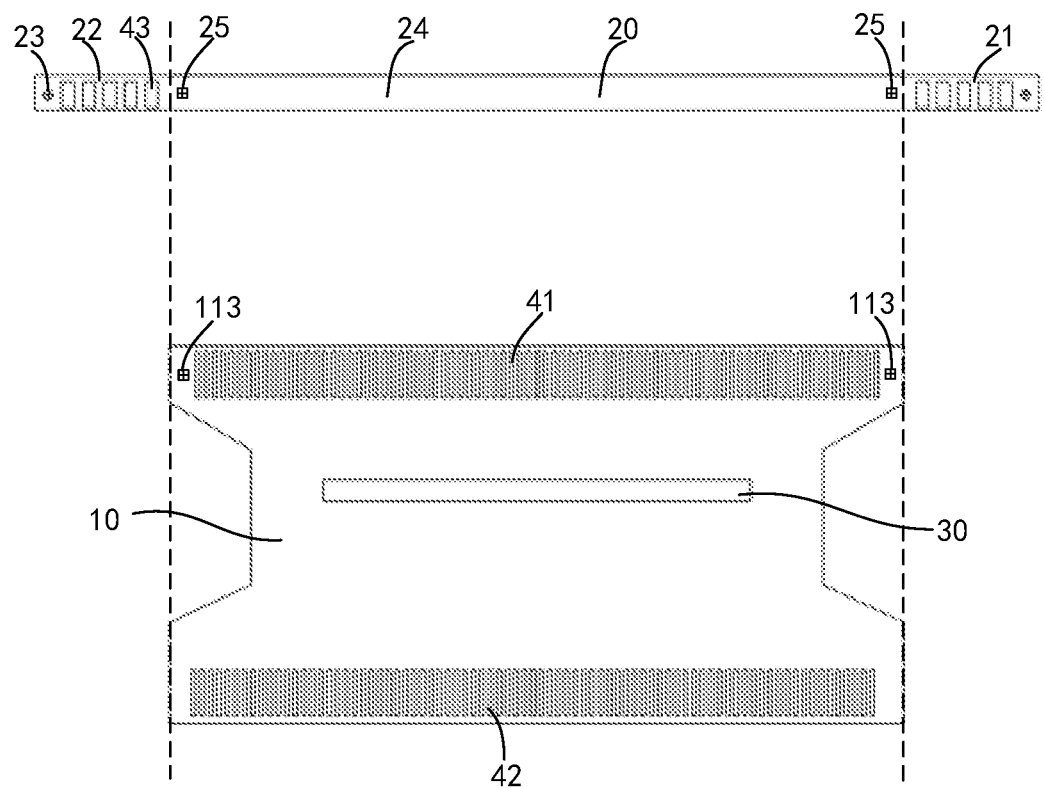
FIG. 3 is a schematic view of a disassembled structure of the COF in FIG. 2.

Furthermore, referring to FIG. 2 and FIG. 3, the first reinforcing part 20 includes the first sub-extending portion 21, the second sub-extending portion 22, and a fixing portion 24 connected between the first sub-extending portion 21 and the second sub-extending portions 22. The fixing portion 24 is fixedly connected to the first bonding portion 11, and the fixing portion 24 is disposed on a side of the first bonding portion 11 away from the first bonding terminals 41. Optionally, the fixing portion 24 and the first bonding portion 11 may be fixedly connected by bonding.

The fixing portion 24 is attached to the first bonding portion 11, so that there is an overlapping area between the first reinforcing part 20 and the first bonding portion 11. Corresponding to the overlapping area, the first reinforcing part 20 is provided with at least two first alignment marks 25, and the first bonding portion 11 is provided with second alignment marks 113 corresponding to the first alignment marks 25, so that the first reinforcing part 20 is aligned and attached to the first bonding portion 11. The first alignment mark 25 is located at an end of the fixing portion 24 close to the first extending portion, and the second alignment mark 113 is located in an area of the first bonding portion 11 near the first end 111 or the second end 112, so as to improve the accuracy of alignment and fit between the first reinforcing part 20 and the first bonding portion 11.

In some embodiments, the fixing portion 24, the first sub-extending portion 21, and the second sub-extending portion 22 are integrated, and materials of the fixing portion 24, the first sub-extending portion 21, and the second sub-extending portion 22 include polycarbonate (PC), polyethylene terephthalate (PET), or other materials with high flexibility, resistance to distortion, and low stress. Thicknesses of the fixing portion 24, the first sub-extending portion 21, and the second sub-extending portion 22 range from 0.08 mm to 0.15 mm.

In some embodiments, at least one third alignment mark 23 is provided on each of the first sub-extending portion 21 and the second sub-extending portion 22. The bonding area BA of the display panel 100 is provided with alignment marks (not illustrated in the figure) corresponding to the third alignment marks 23. By aligning the third alignment marks 23 with the alignment marks on the display panel 100, the COF 300 is bound on the display panel 100. The third alignment mark 23 is located at an end of the first sub-extending portion 21 or the second sub-extending portion 22 away from the fixing portion 24, so as to improve the precision of bonding alignment between the COF 300 and the display panel 100.

Of course, the third alignment marks 23 are not limited to be disposed on the first reinforcing part 20, and the third alignment marks 23 may be arranged on the first bonding portion 11. Alternatively, the third bonding terminal 43 on the first extending portion may be reused as the third alignment mark 23.

Figure 4:
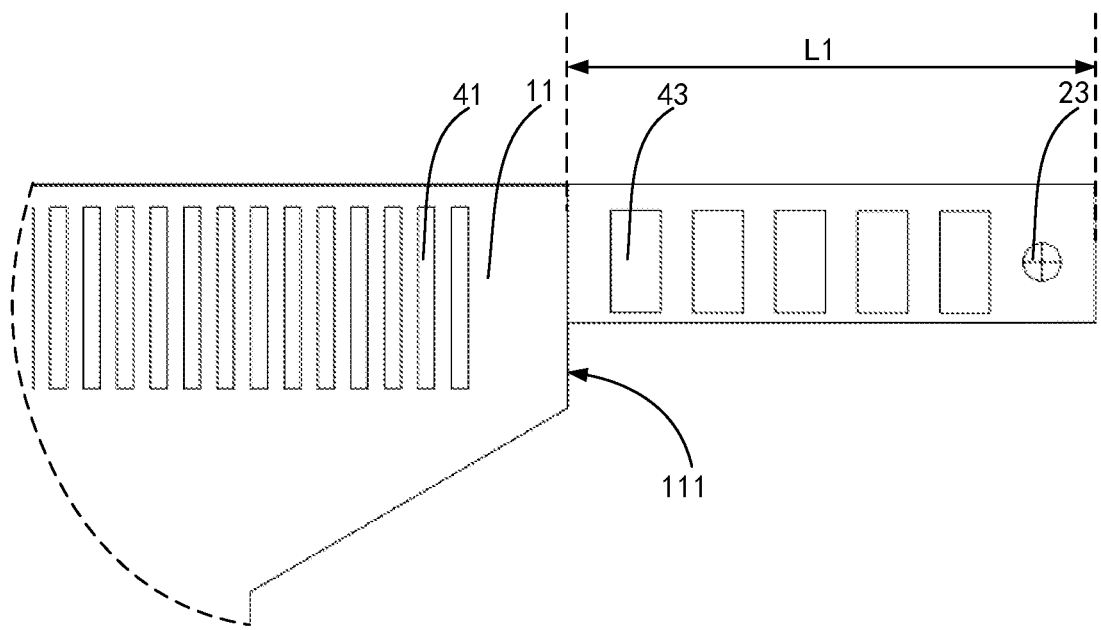
FIG. 4 is a partially enlarged structural schematic view of a first bonding portion in FIG. 2.

Referring to FIG. 4, optionally, the first extending portion is provided with a plurality of third bonding terminals 43 arranged at intervals, and the interval between the third bonding terminals 43 is greater than that of the first bonding terminals to simplify the process. Because the third bonding terminal 43 is not used to transmit signals, and the third bonding terminal 43 is mainly used to bond the first reinforcing part 20 to the display panel 100, so the third bonding terminals 43 do not need to be designed according to the rules of the first bonding terminals 41, thereby reducing the process difficulty of manufacturing the third bonding terminals 43.

In some embodiments, on a condition that a plurality of third bonding terminals 43 are provided on the first extending portion, at least one of the third bonding terminals 43 may be designed in a differentiated manner, so that the differentiated designed third bonding terminal 43 is multiplexed as the third alignment mark 23, so that there is no need to arrange the third alignment mark 23 separately.

In some embodiments, a length of the first extending portion beyond the first bonding portion 11 is greater than 1.5 mm. Taking the first sub-extending portion 21 as an example, a length L1 of the first sub-extending portion 21 is greater than 1.5 mm, so as to improve the reinforcing effect of the first reinforcing part 20 on the first bonding portion 11.

Figure 5:
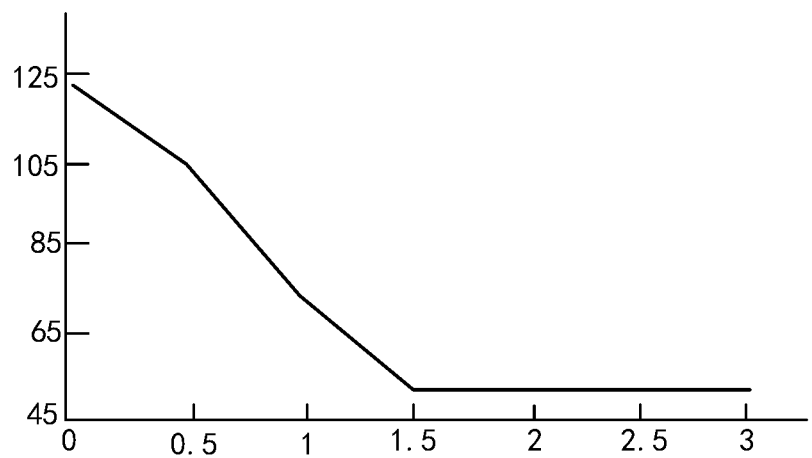
FIG. 5 is a curve diagram of a stress variation of a bonding portion of a COF in the related art.

It should be noted that, referring to FIG. 5, it is found through simulation that, on a condition that the first reinforcing part 20 as disclosed in the present disclosure is not provided, corresponding to an area where the COF and the display panel are bonded, both ends of the COF are relatively more stressed. FIG. 5 shows the stress change at one end of the COF. As illustrated in FIG. 5, it can be seen that the stress on the COF decreases as the distance increases, and the stress on the COF tends to be stable after 1.5 mm. The distance here refers to a distance from a point on the COF to the end of the COF.

In view of above, the length of the first extending portion beyond the first bonding portion 11 is greater than 1.5 mm, so as to bear the torsional stress on the COF 300, thereby reducing the stress on the first bonding portion 11. The torsional stress prevents peeling at the bonding between the first bonding portion 11 and the display panel 100.

Furthermore, in order to reduce the deformation when the COF 300 is subjected to the torsional stress, and in order to release part of the torsional stress borne by the first extending portion, the connecting portion 12 of the COF 300 may be specially designed. Optionally, in the extending direction along the first reinforcing part 20, a tail end of the connecting portion 12 is retracted relative to a tail end of the first bonding portion 11 and/or a tail end of the second bonding portion 13, so as to relieve twisting stress.

In some embodiments, a retraction depth of the connecting portion 12 is less than an extension length of the first reinforcing part 20, so that the connecting portion 12 may not only meet the torsion stress borne by the first extending portion of the release part, but also ensures sufficient width, which enriches a wiring space on the connecting portion 12.

It should be noted that, when designing the retracted depth of the connecting portion 12 and the extension length of the first reinforcing part 20, the retracted depth of the connecting portion 12 and the extension length of the first reinforcing part 20 are negatively correlated. For example, when the extension length of the first reinforcing part 20 is longer, that is, when the length of the first extending portion is longer, the reinforcement effect of the first reinforcing part 20 is better, so that the risk of peeling at the bonding of the bonding portion 11 and the display panel 100 is lower, at this time, the first reinforcing part 20 may withstand greater torsional stress, and the connecting portion 12 may be arranged to have smaller retraction depth to release less torsional stress, so that the connecting portion 12 has enough space for wiring. On the contrary, when the extension length of the first reinforcing part 20 is short, that is, when the length of the first extending portion is short, the reinforcement effect of the first reinforcing part 20 is limited; in order to avoid peeling at the bonding of the first bonding portion 11 and the display panel 100, the connecting portion 12 may be provided with a greater retraction depth to release more torsional stress.

Specifically, continue to refer to FIG. 2, the two opposite ends of the second bonding portion 13 are a third end 131 and a fourth end 132. The third end 131 corresponds to the first end 111 of the first bonding portion 11, and the fourth end 132 corresponds to the second end 112 of the first bonding portion 11. The two opposite ends of the connecting portion 12 are a fifth end 121 and a sixth end 122. The fifth end 121, the first end 111, and the third end 131 are located on a same side of the body part 10, and the fifth end 121 retracts relative to the first end 111 and the third end 131. The sixth end 122, the second end 112, and the fourth end 132 are located on a same side of the body part 10, and the sixth end 122 retracts relative to the second end 112 and the fourth end 132.

In some embodiments, in the extending direction along the first reinforcing part 20, the length of the first bonding portion 11 is equal to the length of the second bonding portion 13, and a tail end of the first bonding portion 11 is flush with a tail end of the second bonding portion 13. In a direction perpendicular to the extending direction of the first reinforcing part 20, a width of the first reinforcing part 20 is less than a width of the first bonding portion 11, so as to reduce the bounded area while ensuring the effective bonding of the COF 300 and the display panel 100, thereby narrow the border of the display panel 100.

Figure 6:
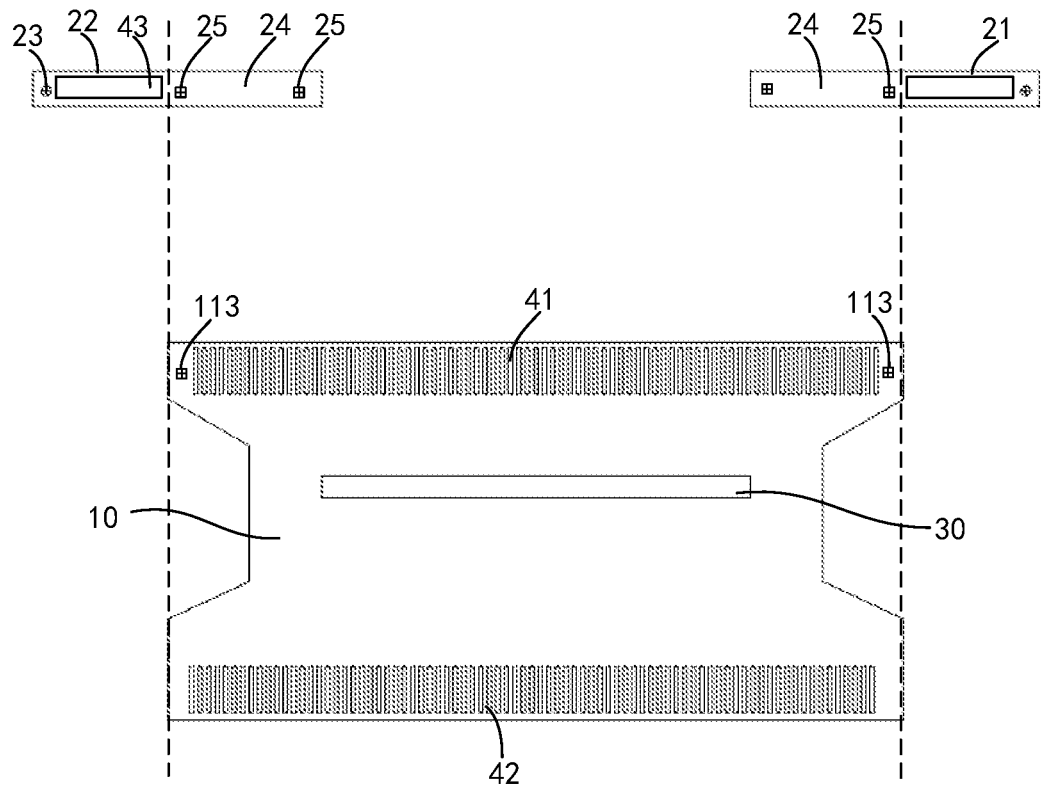
FIG. 6 is a schematic view of another disassembled structure of the COF in FIG. 2.

In an embodiment, referring to FIG. 1 to FIG. 6 in combination. FIG. 6 is a schematic view of another disassembled structure of the COF in FIG. 2. Different from the above embodiment, the fixing portion 24 of the first reinforcing part 20 is divided into two parts, and there is an interval between the two parts of the fixing portion 24. One part of the fixing portion 24 is connected to the first sub-extending portion 21, and the other part of the fixing portion 24 is connected to the second sub-extending portion 22. In this way, the overlapping area between the fixing portion 24 and the first bonding portion 11 may be reduced, so as to reduce the area of the first reinforcing part 20 and save costs.

In addition, each of the first sub-extending portion 21 and the second sub-extending portion 22 is provided with one third bonding terminal 43 thereon. The third bonding terminal 43 is shaped as a strip to further reduce the process difficulty of the third bonding terminal 43. On a condition that only one third bonding terminal 43 is provided, the third bonding terminal 43 may also be reused as the third alignment mark 23. For other descriptions, please refer to the above-mentioned embodiments, which will not be repeated here.

Figure 7:
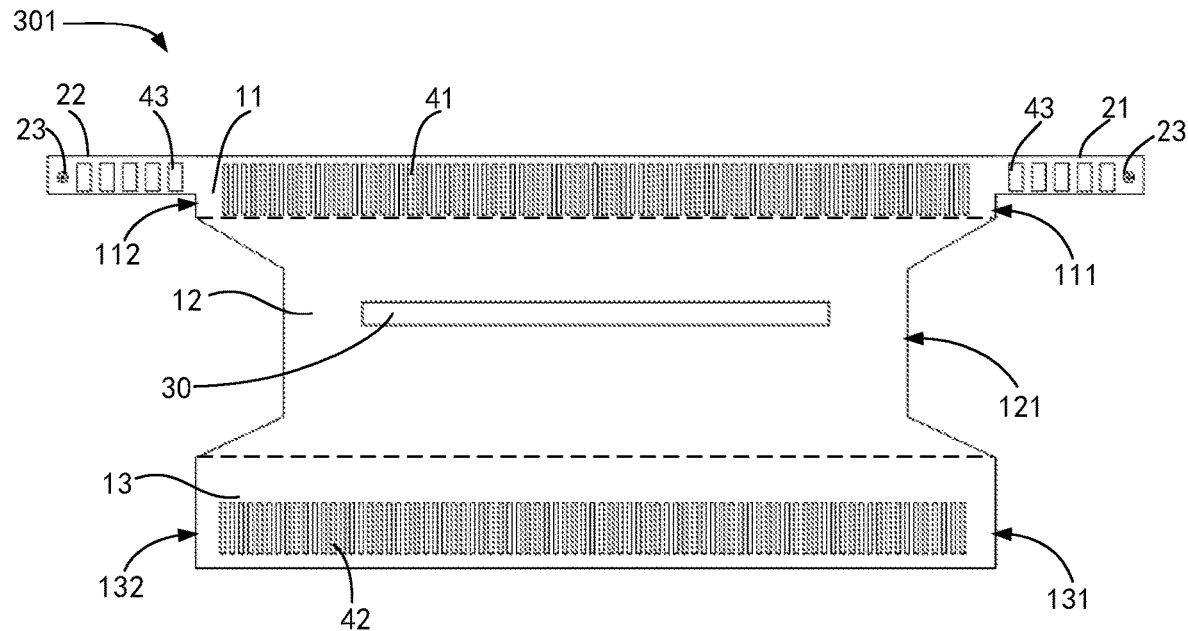
FIG. 7 is a schematic top view of another COF provided according to an embodiment of the present disclosure.

In an embodiment, referring to FIG. 1 to FIG. 7 in combination, and FIG. 7 is a schematic top view of another COF provided by the embodiments of the present disclosure. Different from the above-mentioned embodiments, in the COF 301 of the embodiment, the first reinforcing part 20 is integrated with the first bonding portion 11, and the first reinforcing part 20 is formed by extending the first bonding portion 11 in a direction away from the first bonding portion 11. In this way, the alignment fitting between the first reinforcing part 20 and the first bonding portion 11 is avoided, which simplifies the process. For other descriptions, please refer to the above-mentioned embodiments, which will not be repeated here.

Figure 8:
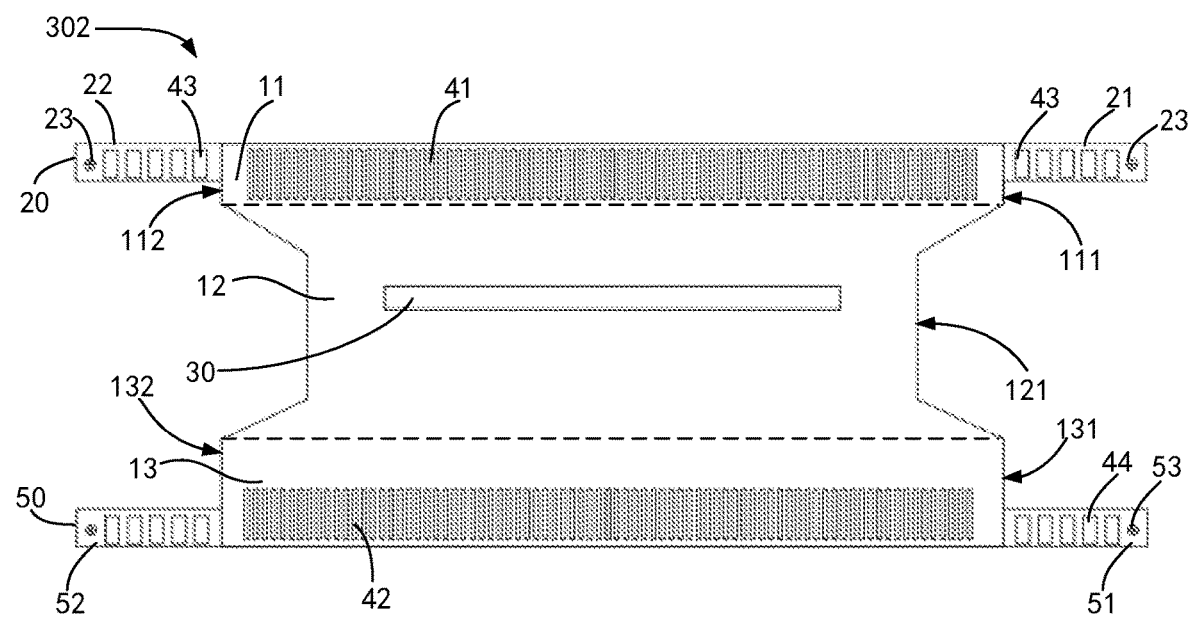
FIG. 8 is a schematic top view of another COF provided according to an embodiment of the present disclosure.

In an embodiment, please refer to FIG. 1 to FIG. 8 in combination, and FIG. 8 is a schematic top view of another COF provided by the embodiments of the present disclosure. Different from the above-mentioned embodiments, in the COF 302 of the embodiment, the COF 302 further includes a second reinforcing part 50 connected to the second bonding portion 13. A second extending portion is formed by extending from at least one of two opposite ends of the second bonding portion 13 in a direction away from the second bonding portion 13, so as to improve the bonding strength between the second bonding portion 13 and the printed circuit board 200 and prevent the second bonding portion 13 from being peeled off from the printed circuit board 200 at the bonding position.

Specifically, the second reinforcing part 50 includes a third sub-extending portion 51 extending from the third end 131 of the second bonding portion 13 in a direction away from the second bonding portion 13 and a fourth sub-extending portion 52 extending the fourth end 132 of the second bonding portion 13 in a direction away from the second bonding portion 13. Both the third sub-extension 51 and the fourth sub-extension 52 are provided with at least one fourth bonding terminal 44 and at least one fourth alignment mark 53 for alignment bonding of the COF 300 and the printed circuit board 200.

It should be noted that a specific structure of the second reinforcing part 50 and a relationship between the second reinforcing part 50 and the second bonding portion 13 may be referred to relevant descriptions of the first reinforcing part 20 in the above-mentioned embodiments, which will not be repeated here.

According to above-mentioned embodiments, in the COF and the display module provided by the present disclosure, the COF includes the body part and the first reinforcing part; the body part includes the first bonding portion, the connecting portion, and the second bonding portion sequentially connected along a first direction, and the connecting portion is connected to the first bonding portion and the second bonding portion; the first reinforcing part is connected to the first bonding portion and includes a first extending portion extending along at least one of the two opposite ends of the first bonding portion in a direction away from the first bonding portion; the first bonding portion is provided with a plurality of first bonding terminals arranged at intervals, the second bonding portion is provided with a plurality of second bonding terminals arranged at intervals, the first extending portion is provided with at least one third bonding terminal, the first bonding terminal is electrically connected to the corresponding second bonding terminal, and the third bonding terminal is insulated from the second bonding terminals. In the present disclosure, the reinforcing part is provided at the end of the bonding portion of the COF to increase the bound area of the COF during bonding, thereby increasing the adhesion of the COF during bonding, increasing the peeling force of the COF, and increasing the twist resistance of the COF in the curved state, which reduces the risk of peeling at the bonding between the COF and the display panel.

In the foregoing embodiments, the descriptions of each embodiment have their own emphases, and for parts not described in detail in a certain embodiment, reference may be made to relevant descriptions of other embodiments.

The above is a detailed introduction of the embodiments of the present disclosure. In this paper, specific examples are used to illustrate the principles and implementation methods of the present disclosure. The description of the above embodiments is only used to help understand technical solutions and their core ideas of the present disclosure. Those of ordinary skill in the art should understand that: it is still possible to modify the technical solutions recorded in the foregoing embodiments, or perform equivalent replacements for some of the technical features; and these modifications or replacements do not make the essence of the corresponding technical solutions depart from the scope of the technical solutions of the embodiments of the present disclosure.

What is claimed is:

1. A chip on film, comprising:
   a body part, comprising:
      a first bonding portion;
      a second bonding portion; and
      a connecting portion connected between the first bonding portion and the second bonding portion; and
   a first reinforcing part, connected to the first bonding portion, and comprising a first extending portion extending from at least one of two opposite ends of the first bonding portion in a direction away from the first bonding portion,
   wherein the first bonding portion is provided with a plurality of first bonding terminals arranged at intervals, the second bonding portion is provided with a plurality of second bonding terminals arranged at intervals, the first extending portion is provided with at least one third bonding terminal, each of the first bonding terminals is electrically connected to a corresponding one of the second bonding terminals, and the third bonding terminal is insulated from the second bonding terminals.

2. The chip on film according to claim 1, wherein the first reinforcing part is provided with two first alignment marks in an overlapping area where the first reinforcing part and the first bonding portion are overlapped, the first bonding portion is provided with second alignment marks corresponding to the first alignment marks, and the first reinforcing part is aligned and attached to the first bonding portion through the first alignment marks and the second alignment marks.

3. The chip on film according to claim 1, wherein the first reinforcing part is integrated with the first bonding portion, and the first reinforcing part is extended from the first bonding portion in a direction away from the first bonding portion.

4. The chip on film according to claim 1, wherein the first extending portion is provided with a plurality of third bonding terminals arranged at intervals, and each of the intervals between the third bonding terminals is greater than an interval between the first bonding terminals.

5. The chip on film according to claim 1, wherein a length of the first extending portion beyond the first bonding portion is greater than 1.5 mm.

6. The chip on film according to claim 1, wherein two opposite ends of the first bonding portion are a first end and a second end, the first extending portion comprises a first sub-extending portion extending from the first end in a direction away from the first bonding portion and a second sub-extending portion extending from the second end in a direction away from the first bonding portion.

7. The chip on film according to claim 6, wherein each of the first sub-extending portion and the second sub-extending portion is provided with a third alignment mark.

8. The chip on film according to claim 6, wherein in an extending direction along the first reinforcing part, a length of the first bonding portion is equal to a length of the second bonding portion.

9. The chip on film according to claim 8, wherein in the extending direction along the first reinforcing part,
    a tail end of the connecting portion is retracted relative to a tail end of the first bonding portion, or
    a tail end of the connecting portion is retracted relative to a tail end of the second bonding portion, or
    a tail end of the connecting portion is retracted relative to a tail end of the first bonding portion and a tail end of the second bonding portion; and
    a retraction depth of the connecting portion is less than an extension length of the first reinforcing part.

10. The chip on film according to claim 6, further comprising a second reinforcing part connected to the second bonding portion, wherein the second reinforcing part comprises a second extending portion extending from one of two opposite ends of the second bonding portion in a direction away from the second bonding portion.

11. A display module, comprising:
    a display panel;
    a chip on film; and
    a printed circuit board, electrically connected to the display panel through the chip on film,
    wherein the chip on film comprises:
    a body part, comprising:
        a first bonding portion;
        a second bonding portion; and
        a connecting portion connected between the first bonding portion and the second bonding portion; and
    a first reinforcing part, connected to the first bonding portion, and comprising a first extending portion extending from at least one of two opposite ends of the first bonding portion in a direction away from the first bonding portion,
    wherein the first bonding portion is provided with a plurality of first bonding terminals arranged at intervals, the second bonding portion is provided with a plurality of second bonding terminals arranged at intervals, the first extending portion is provided with at least one third bonding terminal, each of the first bonding terminals is electrically connected to a corresponding one of the second bonding terminals, and the third bonding terminal is insulated from the second bonding terminals.

12. The display module according to claim 11, wherein the first reinforcing part is provided with two first alignment marks in an overlapping area where the first reinforcing part and the first bonding portion are overlapped, the first bonding portion is provided with second alignment marks corresponding to the first alignment marks, and the first reinforcing part is aligned and attached to the first bonding portion through the first alignment marks and the second alignment marks.

13. The display module according to claim 11, wherein the first reinforcing part is integrated with the first bonding portion, and the first reinforcing part is extended from the first bonding portion in a direction away from the first bonding portion.

14. The display module according to claim 11, wherein the first extending portion is provided with a plurality of third bonding terminals arranged at intervals, and each of the intervals between the third bonding terminals is greater than an interval between the first bonding terminals.

15. The display module according to claim 11, wherein a length of the first extending portion beyond the first bonding portion is greater than 1.5 mm.

16. The display module according to claim 11, wherein two opposite ends of the first bonding portion are a first end and a second end, the first extending portion comprises a first sub-extending portion extending from the first end in a direction away from the first bonding portion and a second sub-extending portion extending from the second end in a direction away from the first bonding portion.

17. The display module according to claim 16, wherein each of the first sub-extending portion and the second sub-extending portion is provided with a third alignment mark.

18. The display module according to claim 16, wherein in an extending direction along the first reinforcing part, a length of the first bonding portion is equal to a length of the second bonding portion.

19. The display module according to claim 18, wherein in the extending direction along the first reinforcing part,
    a tail end of the connecting portion is retracted relative to a tail end of the first bonding portion, or
    a tail end of the connecting portion is retracted relative to a tail end of the second bonding portion, or
    a tail end of the connecting portion is retracted relative to a tail end of the first bonding portion and a tail end of the second bonding portion; and
    a retraction depth of the connecting portion is less than an extension length of the first reinforcing part.

20. The display module according to claim 16, wherein the chip on film further comprises a second reinforcing part connected to the second bonding portion, and the second reinforcing part comprises a second extending portion extending from one of two opposite ends of the second bonding portion in a direction away from the second bonding portion.

* * * * *